United States Patent [19]

Higuchi

[11] Patent Number: 4,699,697

[45] Date of Patent: Oct. 13, 1987

[54] HIGH-PURITY PALLADIUM-NICKEL ALLOY PLATING SOLUTION AND PROCESS

[75] Inventor: Kazuhiro Higuchi, Kanagawa, Japan

[73] Assignee: Electroplating Engineers of Japan, Limited, Tokyo, Japan

[21] Appl. No.: 824,693

[22] PCT Filed: May 23, 1985

[86] PCT No.: PCT/JP85/00285

§ 371 Date: Jan. 17, 1986

§ 102(e) Date: Jan. 17, 1986

[87] PCT Pub. No.: WO85/05381

PCT Pub. Date: Dec. 5, 1985

[30] Foreign Application Priority Data

May 24, 1984 [JP] Japan ................... 59-103720

[51] Int. Cl.$^4$ ............................................. C25D 3/56
[52] U.S. Cl. ................................... 204/44.6; 428/670
[58] Field of Search .................... 204/44.6; 428/670; 200/266, 267, 268

[56] References Cited

U.S. PATENT DOCUMENTS

| 3,580,820 | 5/1971 | Yamamura et al. | 204/44.6 |
| 3,677,909 | 7/1972 | Yamamura et al. | 204/44.6 |
| 4,428,802 | 1/1984 | Kanai et al. | 204/44.6 |

FOREIGN PATENT DOCUMENTS

| 3135597A1 | 5/1982 | Fed. Rep. of Germany | 204/44.6 |
| 46-25604 | 7/1971 | Japan | 204/44.6 |
| 47-18201 | 5/1972 | Japan | 204/44.6 |
| 33177 | 8/1972 | Japan | 204/44.6 |
| 47-33176 | 8/1972 | Japan | 204/44.6 |
| 47-33178 | 8/1972 | Japan | 204/44.6 |
| 77352 | 6/1981 | Japan | 204/44.6 |
| 57-54296 | 3/1982 | Japan | 204/44.6 |
| 57-60090 | 4/1982 | Japan | 204/44.6 |
| 958685 | 5/1964 | United Kingdom | 204/44.6 |
| 1143178 | 2/1969 | United Kingdom | 204/44.6 |
| 1468580 | 3/1977 | United Kingdom | 204/44.6 |

OTHER PUBLICATIONS

Abner Brenner, "Electrodeposition of Alloys", vol. I, p. 75, (1963).

Primary Examiner—T. Tung
Attorney, Agent, or Firm—Flynn, Thiel, Boutell & Tanis

[57] ABSTRACT

The present invention relates to a high-purity palladium-nickel alloy plating, and particularly to a high-purity palladium-nickel alloy plating solution and process suitable as plating for electronic parts, said plating solution and process producing a deposit having a nickel content of 1 to 15%, an article plated with said alloy, and an article plated with said alloy and plated further with gold or a gold alloy.

4 Claims, No Drawings

HIGH-PURITY PALLADIUM-NICKEL ALLOY PLATING SOLUTION AND PROCESS

FIELD OF THE INVENTION

The present invention relates to a high-purity palladium-nickel alloy plating, and particularly to a high-purity palladium-nickel alloy plating solution and process suitable for plating electronic parts, said plating solution and process producing a deposit having a low nickel content, an article plated with said alloy, and an article plated with said alloy and further with gold or a gold alloy.

BACKGROUND OF THE INVENTION

In general, a plating which contains palladium is known to have excellent electrical properties and be economical as compared to precious metal platings such as a gold plating. However, a pure palladium plating containing no other metal has such an intrinsic property that the deposit is liable to occlude hydrogen, leading to high internal stress and easy cracking. Therefore, a palladium-nickel alloy plating by co-depositing nickel has hitherto been widely used, as disclosed, for instance, in Japanese Patent Publication Nos. 46-25604 (1971), 47-33177 (1972) and 47-33178 (1972). The deposit obtained by the palladium-nickel alloy plating is glossy, occludes little hydrogen and is malleable, as contrasted to the pure palladium plating; therefore, a thick plating of the alloy can be obtained with extremely few cracks and favorable adhesion properties.

However, in the case of the conventional palladium-nickel alloy plating, the nickel content of the deposit is high (15% or more), so that the deposit is liable to be attacked by chemicals as nitric acid, and accordingly, such plating can hardly be utilized in the field where high-quality plating is required, for instance, electronic parts.

The present inventor, as a result of various experiments, has found that the abovementioned problems can be overcome if the nickel content of the deposit is not higher than 15%.

The present invention has been attained, based on the abovementioned finding, while paying attention to the prior art. Accordingly, an object of the present invention is to provide a plating solution and a plating process for a high-purity palladium-nickel plating by which a deposit comparable to a pure palladium plating in resistance to chemicals such as nitric acid can be obtained without sacrificing the intrinsic features of palladium-nickel alloy plating, an article plated with the palladium-nickel alloy and an article plated with the palladium-nickel alloy and further with gold or a gold alloy.

DISCLOSURE OF THE INVENTION

To attain the abovementioned object, the high-purity palladium nickel alloy plating solution and process, the article plated with the alloy and the article plated with the alloy and further with gold or a gold alloy according to the present invention are constituted as follows:

(1) A high-purity palladium-nickel alloy plating solution which is characterized in containing at least 5 g/l of palladium added in the form of palladous ammine chloride and 0.5 to 5 g/l of nickel.

(2) A process for plating with a high-purity palladium-nickel alloy which is characterized in comprising adjusting a high-purity palladium-nickel alloy plating solution containing at least 5 g/l of palladium added in the form of palladous ammine chloride and 0.5 to 5 g/l of nickel to a pH 6 to 8, and carrying out plating so that the nickel content of the deposit will be 1 to 15%.

(3) An article plated with a palladium-nickel alloy having a nickel content of 1 to 15%.

(4) An article plated with a palladium-nickle alloy having a nickel content of 1 to 15% and plated further with gold or a gold alloy.

If at least 5 g/l of palladium is not added as palladous ammine chloride, the so-called "burnt deposit" will be generated in the plating, thereby spoiling the intrinsic action of the palladium-nickel alloy plating, namely, the action of obtaining a glossy, malleable deposit which occludes little hydrogen and can have a large thickness with few cracks and favorable adhesion properties. Palladium can be used in any large amount not less than 5 g/l.

Like palladium, nickel is used in an amount of not less than 0.5 g/l, in order that the nickel content of the deposit will be not less than 1%. In order to restrict the nickel content of the deposit to 15% or less, the amount of nickel added must be less than 5 g/l. It is essential to maintain the pH of the plating solution in a substantially neutral range of 6 to 8. If the pH is less than 6, the deposit will be blackish in color and brittle. Although a favorable deposit can be obtained at a pH of more than 8, as the pH increases, ammonium of ammonium salts in the plating solution is gradually liberated to produce a stronger ammonium odor, resulting in a worse working condition.

BEST MODE OF EXECUTING THE INVENTION

Representative examples of the invention will be described below.

EXAMPLE 1

Composition of plating solution:

| | |
|---|---|
| Palladium (as Pallaadous ammine chloride) | 15 g/l |
| Nickel (as Nickel chloride) | 2 g/l |
| Ammonium chloride | 50 g/l |
| Ammonium sulfamate | 80 g/l |
| Ammonium sulfate | 40 g/l |
| Sodium formylbenzenesulfonate | 1 g/l |
| Plating conditions: | |
| By adding ammonium or sulfuric acid | pH 7.0 |
| Temperature | 50° C. |
| Agitation | Intermediate, by magnetic stirrer |
| Anode | Insoluble anode consisting of titanium plated with platinum |
| Object to be plated | Test piece obtained by bright-plating a brass plate (2 × 4 cm) with nickel in a thickness of about 10 μm, followed by specular gloss finishing and gold strike plating |
| Current density | 1 A/dm$^2$ |
| Time | 20 min |

In the above composition, ammonium chloride and ammonium sulfamate are used for imparting electrical conductivity to the plating solution. Other than these salts, one or more of inorganic salts such as ammonium phosphate and organic acid salts such as ammonium citrate may be used singly or in combination. The amount of these salts is suitably 50 to 200 g/l. Ammonium sulfate is added for supplying sulfate ions into the plating solution, and by providing sulfate ions in the solution in an amount of about 10 to 100 g/l, the gloss of the deposit can be improved. Sodium formylbenzenesulfonate functions to ensure uniform appearance of the deposit and to prevent "unevenness" or "stain" from being generated in the gloss, and the amount thereof is suitably 0.1 to 5 g/l. As has been mentioned above, it is essential to maintain the pH of the plating solution in a substantially neutral range of 6 to 8. If the pH is less than 6, the deposit will be blackish in color and brittle. Although a favorable deposit can be obtained at a pH of more than 8, as the pH increases, ammonium of the ammonium salts in the plating solution is gradually liberated to produce a stronger ammonium odor, resulting in a worse working condition.

The deposit obtained by the palladium-nickel alloy plating under the abovementioned composition and conditions had a specular gloss comparable or superior to that of the appearance (gold strike plated appearance) of the test piece, was 3 $\mu$m in thickness and had good adhesion. Also, when plating was conducted using the same plating solution as above using current density of 3 A/dm$^2$ for 7 min, a favorable glossy deposit of 3 $\mu$m in thickness was obtained.

EXAMPLE 2

| | |
|---|---|
| Composition of plating solution: | the same as in Example 1 |
| Plating conditions: | pH, temperature, agitation and anode were the same as in Example 1 |
| Object to be plated | Test piece obtained by bright-plating a brass plate (2 × 4 cm) with nickel in a thickness of about 10 $\mu$m, followed by specular gloss finishing (not subjected to gold strike plating) |
| Current density | 1 A/dm$^2$, 3 A/dm$^2$ |
| Time | 35 min, 12 min |

In this example, as shown above, the same plating solution as that in Example 1 was used, and the test piece prepared by subjecting the brass plate to nickel bright plating but not to gold strike plating was plated with the palladium-nickel alloy using a current density of 1 A/dm$^2$ for 35 min and a current density of 3 A/dm$^2$ for 12 min. The absence of gold strike plating in this example was intended for making the nickel-plated surface of the test piece somewhat inactive, thereby intentionally making poor the adhesion of the palladium-nickel alloy plating so that the alloy plating film can be easily released for analysis thereof after plating. The deposits obtained in this example had a uniform glossy appearance which was slightly inferior to the original nickel-plated surface. When the four side faces of the two test pieces thus plated were ground by sand paper, four palladium-nickel alloy films (sheets) were released from the face and back sides of each of the test pieces. The thickness of each of the films was determined by a micrometer to be about 5 $\mu$m. Parts of the plating films were dissolved in aqua regia, and the nickel contents of the deposits were analyzed to be 3.5% and 4.3%, respectively. To evaluate the chemical resistance of the deposits, a plating film with a nickel content of 20% obtained by using a plating solution PALLADEX VIII (commercial name) produced by Electroplating Engineers of Japan Limited and a nickel-free pure palladium plating film obtained by using a plating solution PALLADEX IV (commercial name) were prepared, separately from the plating films obtained according to the present invention. Concentrated nitric acid was dropped onto the plating films by a squirt, and the state of the films after 2 min was observed. The pure palladium plating film and the plating films according to the present invention showed little change, while the film with the nickel content of 20% turned yellowish brown and was dissolved to such a degree that the substrate was exposed.

EXAMPLE 3

Plating was carried out in the same manner as in the above examples except that the amount of nickel added to the plating solution of Example 1 was changed to 1 g/l, 3 g/l, 5 g/l and 10 g/l, then the relationship between the amounts of nickel added and the nickel content of the resultant deposit films was investigated, and the chemical resistance of the films was comparatively evaluated. Every one of the thus obtained films showed a favorable glossy appearance. The nickel contents of the films were analyzed to be 1.5%, 5.5%, 15% and 17.5%, respectively. When concentrated nitric acid was dropped onto the films by a squirt as in Example 2, only the film with the nickel content of 17.5% turned yellowish brown after 2 min, and was dissolved to such a degree that the substrate was exposed.

EXAMPLE 4

When a connector which is an electronic part was plated with the palladium-nickel alloy by using the abovementioned plating solution under the abovementioned plating conditions, a connector having excellent electrical properties and chemical resistance could be obtained. When the connectors thus plated with the palladium-nickel alloy were plated respectively with gold and a gold alloy, the resultant connectors showed excellent electrical properties and chemical resistance comparable to those of a pure gold plated connector.

POSSIBLE INDUSTRIAL USE OF THE INVENTION

Since the high-purity palladium-nickel alloy plating solution and process, the article plated with said alloy, and the article plated with said alloy and further with gold or a gold alloy according to the present invention are as explained above, they have the intrinsic feature of palladium-nickel alloy plating, namely, the feature of obtaining a glossy, malleable deposit which occludes little hydrogen and can have a large thickness with few cracks and favorable adhesion properties, and simultaneously, they have the effect that the deposit is resistant to chemicals such as nitric acid, and the plating is extremely advantageous as plating for electronic parts (first invention) (second invention).

In addition, an article plated with the palladium-nickel alloy obtained as a deposit according to the present invention is excellent in electrical properties, chemical resistance, etc.; therefore, such articles can be widely used for not only electronic parts such as connectors, contacts and printed circuit boards but also necklaces, brooches, spectacle frames, knives, forks, etc.

Further, an article plated with the abovementioned palladium-nickel alloy and further with gold or a gold alloy has good appearance, is excellent in electrical properties, in chemical resistance, etc., like a pure gold plating, and is more economical than the pure gold plating because of the smaller amount of gold plating required (fourth invention).

I claim:

1. A high-purity palladium-nickel alloy plating solution comprising at least 5 g/l of palladium added in the form of palladous ammine chloride, 0.5 to 2.0 g/l of nickel, from 0.1 to 5 g/l of sodium formylbenzenesulfonate, from 50 to 200 g/l of at least one ammonium salt other than ammonium sulfate for imparting electrical conductivity to the plating solution and from 10 to 100 g/l of ammonium sulfate.

2. A process for plating with a high-purity palladium-nickel alloy which comprises: electroplating a substrate using, as a plating bath, a high-purity palladium-nickel alloy plating solution containing at least 5 g/l of palladium added in the form of palladous ammine chloride, 0.5 to 2.0 g/l of nickel, from 0.1 to 5 g/l of sodium formylbenzenesulfonate, from 50 to 200 g/l of at least one ammonium salt other than ammonium sulfate for imparting electrical conductivity to the plating solution and from 10 to 100 g/l of ammonium sulfate for supplying sulfate ions to the plating solution, said plating solution having a pH of 6 to 8, so that the nickel content of the deposit will be in the range of from 1 to 15%.

3. A high-purity palladium-nickel alloy plating solution comprising at least 5 g/l of palladium in the form of palladous ammine chloride, 0.5 to 1 g/l of nickel, from 0.1 to 5 g/l of sodium formylbenzenesulfonate, from 50 to 200 g/l of at least one ammonium salt other than ammonium sulfate for imparting electrical conductivity to the plating solution and from 10 to 100 g/l of ammonium sulfate.

4. A process for plating with a high-purity palladium-nickel alloy which comprises: electroplating a substrate using, as a plating bath, a high-purity palladium-nickel alloy plating solution containing at least 5 g/l of palladium added in the form of palladous ammine chloride, from 0.5 to 1.0 g/ of nickel, from 0.1 to 5 g/l of sodium formylbenzenesulfonate, from 50 to 200 g/l of at least one ammonium salt other than ammonium sulfate for imparting electrical conductivity to the plating solution and from 10 to 100 g/l of ammonium sulfate for supplying sulfate ions to the plating solution, said plating solution having a pH of 6 to 8, so that the nickel content of the plated deposit will be in the range of from 1 to 15%.

* * * * *